(12) United States Patent
Hongo et al.

(10) Patent No.: US 6,656,322 B2
(45) Date of Patent: Dec. 2, 2003

(54) PLASMA PROCESSING APPARATUS

(75) Inventors: Toshiaki Hongo, Nirasaki (JP); Tetsu Osawa, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/982,785

(22) Filed: Oct. 22, 2001

(65) Prior Publication Data

US 2002/0046808 A1 Apr. 25, 2002

(30) Foreign Application Priority Data

Oct. 23, 2000 (JP) ........................................ 2000-322097

(51) Int. Cl.$^7$ ............................ H05H 1/00; C23C 16/00
(52) U.S. Cl. ............................. 156/345.41; 118/723 MW
(58) Field of Search ........................... 156/345.41, 345.36, 156/345.42, 345.43; 118/723 MW, 723 ME, 723 MR, 723 E, 723 MA

(56) References Cited

U.S. PATENT DOCUMENTS

| 5,539,179 A | * | 7/1996 | Nozawa et al. ......... 219/121.43 |
| 5,946,184 A | * | 8/1999 | Kanno et al. ............... 361/234 |
| 6,054,013 A | * | 4/2000 | Collins et al. .............. 156/345 |
| 6,076,484 A | * | 6/2000 | Matsumoto et al. 118/723 MW |

FOREIGN PATENT DOCUMENTS

| JP | 3-68771 A | * | 3/1991 | ........... C23C/16/50 |
| JP | 3-191073 | | 8/1991 | |
| JP | 5-343334 | | 12/1993 | |
| JP | 8-241797 A | * | 9/1996 | ............ H05H/1/46 |
| JP | 9-139379 A | * | 5/1997 | ....... H01L/21/3065 |
| JP | 9-181052 | | 7/1997 | |
| JP | 11-204295 A | * | 7/1999 | ............ H05H/1/46 |
| JP | 2000-012292 A | * | 1/2000 | ............ H05H/1/46 |
| JP | 2000-48997 A | * | 2/2000 | ............ H05H/1/46 |
| JP | 2000-164391 A | * | 6/2000 | ............ H05H/1/46 |
| JP | 2000-164392 A | * | 6/2000 | ............ H05H/1/46 |
| JP | 2000-165573 A | * | 6/2000 | ....... H01L/21/3065 |
| JP | 2000-173989 A | * | 6/2000 | ....... H01L/21/3065 |
| JP | 2000-260747 A | * | 9/2000 | ....... H01L/21/3065 |
| JP | 2000-268996 A | * | 9/2000 | ............ H05H/1/46 |

* cited by examiner

*Primary Examiner*—Parviz Hassanzadeh
(74) *Attorney, Agent, or Firm*—Finnegan, Henderson, Farabow, Garrett & Dunner, LLP

(57) ABSTRACT

A plasma processing apparatus includes, in order to enhance the planar uniformity of the plasma density in a process space, a process chamber, an insulating plate attached airtightly to the ceiling of the process chamber, a planar antenna member placed above the insulating plate and including microwave radiation holes for transmitting therethrough microwave used for generating plasma, and a shield electrode member placed between the insulating plate and the planar antenna member for blocking out radiation of the microwave from the center and a part therearound of the planar antenna member.

15 Claims, 6 Drawing Sheets

PLASMA PROCESSING APPARATUS

BACKGROUND OF THE INVENTION

1. Field of the Invention

The present invention relates to a plasma processing apparatus used for processing semiconductor wafers and the like by the action of a plasma generated by microwave.

2. Description of the Background Art

In recent years, semiconductor products have been increased in density and reduced in size to a great degree. Accordingly, some manufacturing processes of the semiconductor products employ a plasma processing apparatus for such processing as film deposition, etching and ashing. In particular, there is a tendency to use a microwave plasma apparatus since the microwave plasma apparatus can produce a plasma in a stable manner even in a high-vacuum state of a relatively low pressure, specifically from about 0.1 to several tens of mTorr, by using the microwave or a combination of the microwave and a magnetic field from a ring-shaped coil to produce a high-density plasma.

Such a microwave plasma processing apparatus is disclosed for example in Japanese Patent Laying-Open Nos. 3-191073 and 5-343334 and Japanese Patent Laying-Open No. 9-181052 filed by the applicant of the present application. A general plasma processing apparatus using the microwave is described briefly below in conjunction with FIGS. 11 and 12. FIG. 11 shows a structure of a conventional and generally employed plasma processing apparatus and FIG. 12 is a plan view of a planar antenna member.

Referring to FIG. 11, a plasma processing apparatus 2 includes a process chamber 4 which can be evacuated, a mount base 6 on which a semiconductor wafer W is mounted, and an insulating plate 8 provided in an airtight manner on a ceiling opposite to mount base 6. Insulating plate 8 transmitting microwave is formed of aluminum nitride or the like in the shape of a disk, for example.

Plasma processing apparatus 2 further includes, on the upper side of insulating plate 8, a planar antenna member 10 in the shape of a disk with a thickness of several millimeters as shown in FIG. 12 and a wave-delay member 12 formed of a dielectric for example for decreasing the wavelength of microwave in the radial direction of planar antenna member 10 as required. In addition, plasma processing apparatus 2 includes a ceiling cooling jacket 16 above wave-delay member 12 that has a cooling channel 14 formed for flowing a cooling water therein in order to cool wave-delay member 12 and the like. Antenna member 10 includes a great number of microwave radiation holes 18 that are through holes nearly circular or in the shape of slit (circular holes are shown in FIG. 12). In general, microwave radiation holes 18 are arranged concentrically as shown in FIG. 12 or spirally. An internal cable 22 of a coaxial waveguide 20 is connected to the central part of planar antenna member 10 for guiding a microwave of 2.45 GHz for example produced by a microwave generator (not shown). The microwave is transmitted radially in the radial direction of antenna member 10 and also discharged from microwave radiation holes 18 provided in antenna member 10 to be transmitted downward through insulating plate 8 into process chamber 4. The microwave causes a plasma in process chamber 4 for performing a predetermined plasma process such as etching and film deposition for a semiconductor wafer.

When the plasma processing apparatus as described above is used to carry out a predetermined plasma process for semiconductor wafer W, the plasma process must be performed uniformly over the wafer surface in order to enhance the yield. Then, it is required to render the plasma density uniform in a process space S directly above the wafer surface.

However, the plasma density tends to be considerably higher in the central portion of process space S, which is directly below the central part of planar antenna member 10 as described above that has no microwave radiation hole 18 provided therein, namely so-called blind part 24, compared with the density of the peripheral portion surrounding the central portion of process space S. A resultant problem is that the plasma density has a lower uniformity. FIG. 13 shows a graph illustrating a plasma density distribution in the process space where the supplying power of the microwave is varied successively from 700 to 2000 W (watt). According to this graph, the plasma density of the wafer central part (central portion of process space S) is remarkably higher than that of the peripheral part and thus the plasma density is undesirably nonuniform. This problem arises possibly for the reason described below. When the apparatus operates, planar antenna member 10 acts as an upper electrode while mount base 6 acts as a lower electrode so that a capacitive coupling component is generated between these electrodes, which results in a so-called parallel-plate mode of the microwave. Thus the microwave transmitted from the central part of planar antenna member 10 to the peripheral part is reflected from the peripheral part and accordingly returned to and concentrated in the central part. Then, although no microwave radiation hole 18 is provided in the central part, the microwave is radiated downward from blind part 24 at the central part.

SUMMARY OF THE INVENTION

One object of the present invention is to provide a plasma processing apparatus with an improved planar uniformity of the plasma density in a process space.

A plasma processing apparatus according to one aspect of the present invention includes a process chamber including an opened ceiling and an internal space which can be evacuated, an insulating plate airtightly attached to the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave transmitted through the insulating plate into the process chamber, gas supply means for supplying a predetermined gas into the process chamber, and a shield electrode member placed between the insulating plate and the planar antenna member for partially blocking out radiation of the microwave from the planar antenna member.

In the structure described above, a part of radiation of the microwave from the planar antenna member is blocked out and thus the part of radiation is not supplied into the process space. Then, an appropriate selection of any portion blocking out the microwave makes it possible to enhance the planar uniformity of the plasma density.

Typically, the shield electrode member blocks out radiation of microwave from the center and a part therearound of the planar antenna member. In this way, the plasma density in the central portion of the process space can be lowered to further enhance the planar uniformity of the plasma density.

In order to block out radiation from the center and the part therearound of the planar antenna member, the shield electrode member includes, for example, a disk-shaped electrode body placed opposite the center and the part therearound of the planar antenna member, a ring-shaped conductive frame placed to concentrically surround the electrode body, and a conductive arm connecting the electrode body and ring-shaped conductive frame and supporting the electrode body.

Preferably, the conductive arm is displaced from the microwave radiation hole of the planar antenna member. Then, the microwave radiated from the microwave radiation hole is not absorbed by the conductive arm and is accordingly supplied into the process chamber, so that the efficiency of use of the microwave can be enhanced.

According to one preferred embodiment, the shield electrode member includes a microwave transmission window corresponding in position to the microwave radiation hole of the planar antenna member. When the planar antenna member includes a plurality of microwave radiation holes formed at a predetermined pitch, the shield electrode member includes microwave transmission windows respectively corresponding in position to the microwave radiation holes. Thus, the microwave radiated from the microwave radiation holes is not absorbed by the conductive arm and is accordingly supplied into the process chamber, so that the efficiency of use of the microwave can be enhanced.

The microwave transmission windows include for example a through hole pierced through the shield electrode member and a through recess cut inward from the periphery of the shield electrode member.

The shield electrode member is placed apart from the planar antenna member, for example. In this case, a protection plate may be placed between the shield electrode member and the planar antenna member for preventing discharge from occurring between the shield electrode member and planar antenna member. In this way, abnormal discharge can be prevented from occurring between the shield electrode member and planar antenna member. Here, as another example, the shield electrode member may be bonded to be secured onto the insulating plate by an adhesive.

A plasma processing apparatus according to another aspect of the present invention includes a process chamber including an opened ceiling and an internal space which can be evacuated, an insulating plate airtightly attached to the ceiling of the process chamber, a mount base placed in the process chamber for mounting thereon a workpiece to be processed, a planar antenna member placed above the insulating plate and including a plurality of microwave radiation holes formed at a predetermined pitch for transmitting therethrough microwave used for generating plasma, the microwave transmitted through the insulating plate into the process chamber, gas supply means for supplying a predetermined gas into the process chamber, and a shield electrode member placed between the insulating plate and the planar antenna member for blocking out radiation of the microwave from the center and a part therearound of the planar antenna member.

According to still another aspect of the present invention, a plasma processing apparatus includes a process chamber including an opened ceiling and an internal space which can be evacuated, an insulating plate airtightly attached to the ceiling of the process chamber, a mount base placed in the process chamber for mounting thereon a workpiece to be processed, a planar antenna member placed above the insulating plate and including a plurality of microwave radiation holes formed at a predetermined pitch for transmitting therethrough microwave used for generating plasma, the microwave transmitted through the insulating plate into the process chamber, gas supply means for supplying a predetermined gas into the process chamber, and a shield electrode member placed between the insulating plate and the planar antenna member and including microwave transmission windows respectively corresponding in position to the microwave radiation holes of the planar antenna member for blocking out radiation of the microwave from the center and a part therearound of the planar antenna member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
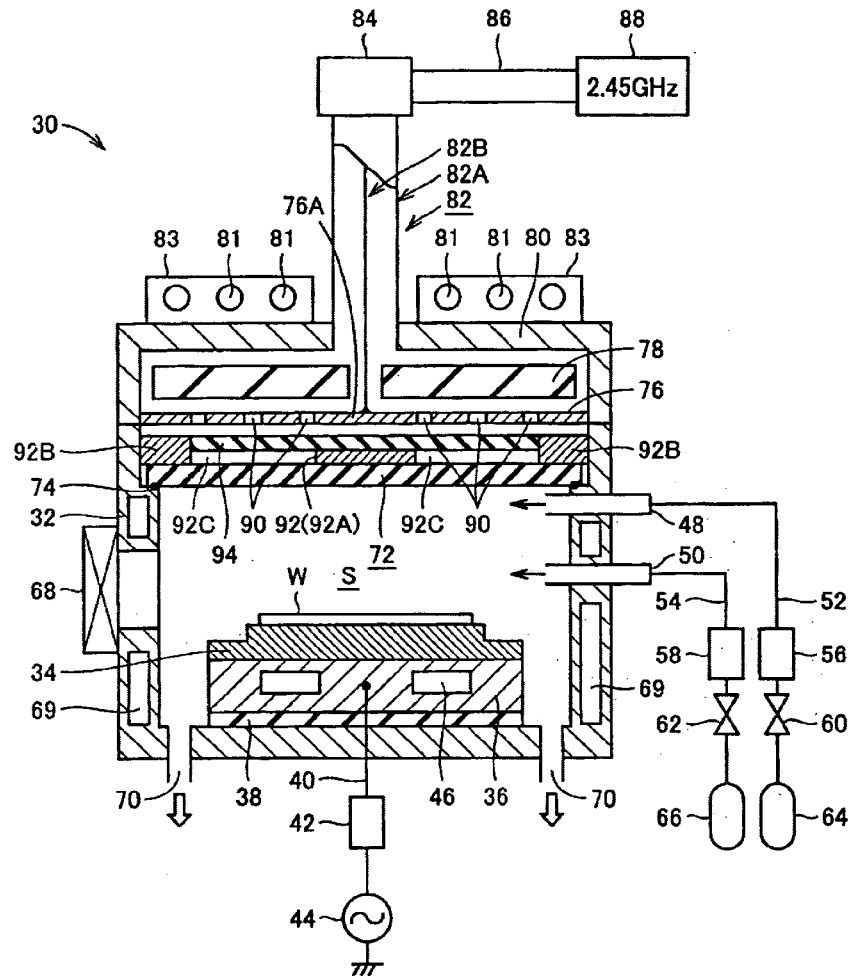
FIG. 1 diagrammatically shows a cross section of a plasma processing apparatus as an example according to one embodiment of the present invention.

A plasma processing apparatus according to one embodiment of the present invention is now described in detail in conjunction with attached drawings.

According to this embodiment, the plasma processing apparatus is applied to plasma CVD (Chemical Vapor Deposition) processing and accordingly explained. As shown, this plasma processing apparatus 30 includes a process chamber 32 formed entirely in a tubular shape with its sidewall and bottom formed of a conductor such as aluminum, for example. The inside of process chamber 32 is constituted of a sealed process space S.

In process chamber 32, a mount base 34 is housed on which a semiconductor wafer W for example is mounted as a workpiece to be processed. Mount base 34 made of anodized aluminum for example is nearly cylindrical in shape with a flat protrusion. The bottom of mount base 34 is supported by a support base 36 also made of aluminum for example and formed in the shape of a cylinder. Support base 36 is placed within process chamber 32 on the bottom thereof via an insulating member 38.

On the upper side of mount base 34, an electrostatic chuck or clamping mechanism (not shown) is provided for holding a wafer. Mount base 34 is connected, via a feeder line 40, to a matching box 42 and a high-frequency power source 44 for bias of 13.56 MHz for example. In some cases, high-frequency bias power source 44 may not be provided.

Support base 36 supporting mount base 34 includes a cooling jacket 46 where a cooling water flows for cooling a wafer being subjected to plasma processing. As required, a heater may be provided in mount base 34.

The sidewall of process chamber 32 is provided with a plasma gas supply nozzle 48 formed of a quartz pipe for supplying a plasma gas such as argon gas for example into the chamber as well as a process gas supply nozzle 50 formed of a quartz pipe for example for supplying a process gas such as deposition gas for example. These nozzles 48 and 50 are connected respectively to a plasma gas source 64 and a process gas source 66 by respective gas supply paths 52 and 54 via mass-flow controllers 56 and 58 and open-close valves 60 and 62. A deposition gas such as $SiH_4$, $O_2$ and $N_2$ for example may be used as the process gas.

Moreover, a gate valve 68 is provided on the periphery of the sidewall of the chamber 32 that opens and closes when a wafer is transported into or out of the chamber, and a cooling jacket 69 is further provided for cooling the sidewall. An exhaust outlet 70 is provided to the bottom of process chamber 32 that is connected to a vacuum pump (not shown) in order to evacuate the inside of process chamber 32 as required to a predetermined pressure.

The ceiling of process chamber 32 is opened where an insulating plate 72 is provided in an airtight manner via a sealing member 74 such as O-ring. Insulating plate 72 transmitting microwave is made of a ceramic material such as AlN for example with a thickness of approximately 20 mm.

Above insulating plate 72, a disk-shaped planar antenna member 76 and a wave-delay member 78 having a high-permittivity property are provided. Specifically, planar antenna member 76 is formed to constitute a bottom plate of a waveguide box 80 formed of a hollow cylindrical vessel shaped to be integrated with process chamber 32. Planar antenna member 76 is provided opposite mount base 34 within process chamber 32.

An outer tube 82A of a coaxial waveguide 82 is connected to the center in the upper portion of waveguide box 80, and an internal cable 82B within waveguide 82 is connected to the central part of planar antenna member 76. Coaxial waveguide 82 is connected to a microwave generator 88 of 2.45 GHz for example via a mode converter 84 and a waveguide 86, for transmitting microwave to planar antenna member 76. The frequency is not limited to 2.45 GHz and another frequency, 8.35 GHz for example, may be used. As the waveguide, a waveguide having a circular or rectangular cross section or coaxial waveguide may be employed. According to this embodiment, the coaxial waveguide is used. On the upper side of waveguide box 80, a ceiling cooling jacket 83 is provided having a cooling channel 81 formed therein for flowing a cooling water and accordingly cooling wave-delay member 78. As wave-delay member 78 having the high-permittivity property is provided within waveguide box 80 and on the upper side of planar antenna member 76, the guide wavelength of microwave is decreased by the wavelength-shortening effect of wave-delay member 78. Aluminum nitride for example may be used as wave-delay member 78.

Figure 3:
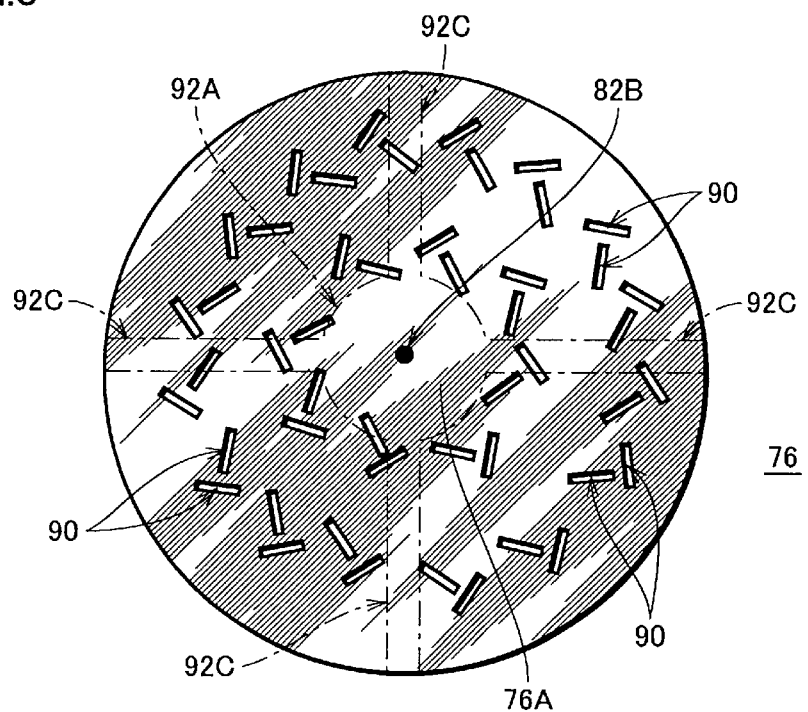
FIG. 3 is a plan view of a planar antenna member as an example.

When planar antenna member 76 is applied to an 8-inch wafer, planar antenna member 76 is formed of a disk made of a conductive material with a diameter from 30 to 40 mm and a thickness from 1 to several millimeters, particularly 5 mm for example. Specifically, planar antenna member 76 is formed for example of a copper plate or aluminum plate with its surface plated with silver. As shown in FIG. 3, this disk has a great number of microwave radiation holes 90 formed of through holes each in the shape of an elongated slit for example. Radiation holes 90 paired to form the shape of T with a gap are almost uniformly arranged over antenna member 76 except for a blind part 76A explained below. The region around the center of planar antenna member 76 forms so-called blind part 76A where no microwave radiation hole 90 is provided. Blind part 76A is approximately 100 mm in diameter. The periphery of planar antenna member 76 is connected to waveguide box 80 and is grounded. The arrangement of microwave radiation holes 90 is not particularly limited. For example, microwave radiation holes 90 may concentrically, spirally or radially arranged for example. In addition, the shape of microwave radiation holes 90 is not limited to the slit. For example, the microwave radiation holes may be formed of circular through holes.

Figure 2:
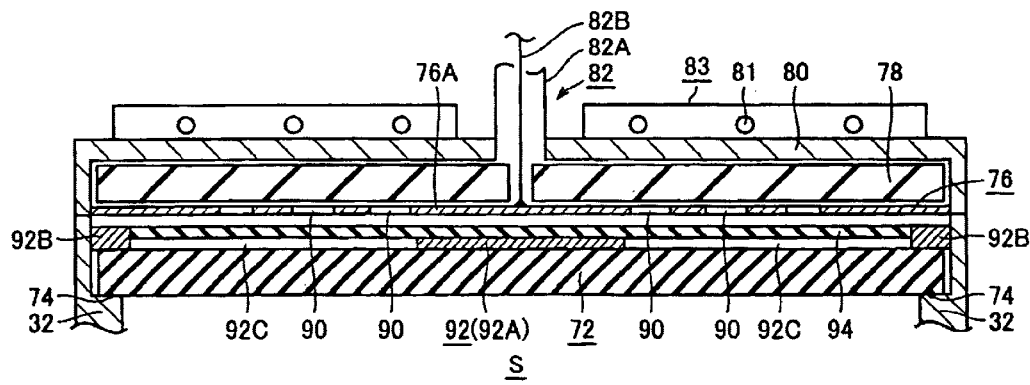
FIG. 2 is a partially enlarged view of the plasma processing apparatus shown in FIG. 1.

Referring back to FIG. 1 or FIG. 2, a shield electrode member 92 which characterizes the present invention is provided between planar antenna member 76 formed as discussed above and insulating plate 72. A protection plate 94 is provided on the upper side of shield electrode member 92 (see FIGS. 4 and 5 together with FIGS. 1 and 2). Shield electrode member 92 is entirely formed of a thin conductive material, for example, a copper plate or aluminum plate. Specifically, shield electrode member 92 is constituted of a disk-shaped electrode body 92A placed to correspond to blind part 76A around the center of planar antenna member 76, a ring-shaped conductive frame 92B concentrically placed on the peripheral side of electrode body 92A and a conductive arm 92C connecting electrode body 92A and conductive frame 92B and supporting electrode body 92A (see FIG. 4).

Figure 4:
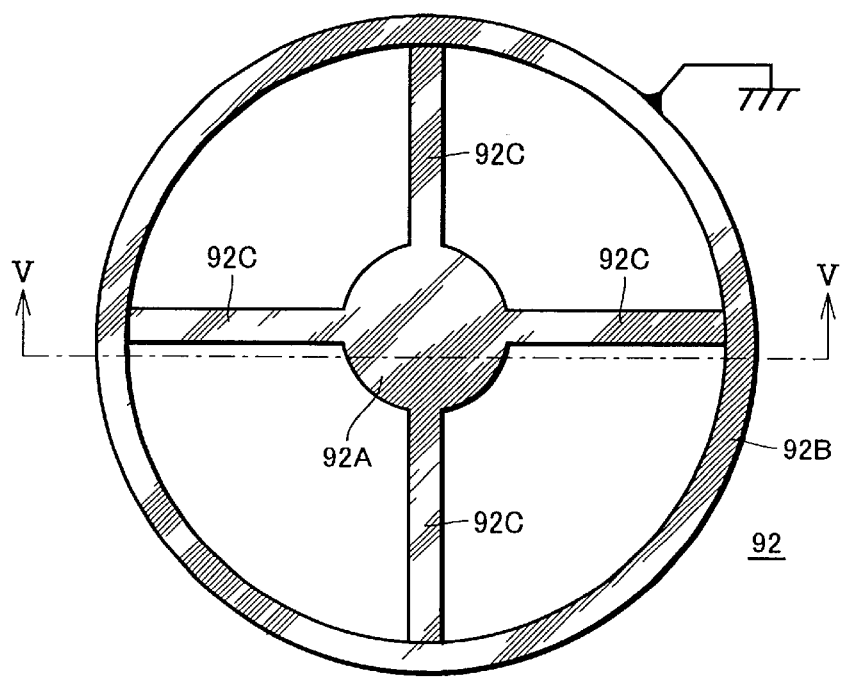
FIG. 4 is a plan view of a shield electrode as an example.
Figure 5:
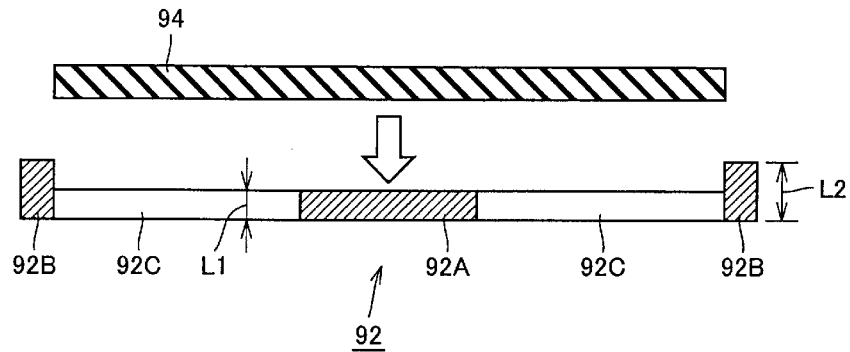
FIG. 5 is a cross sectional view illustrating assembling of a protection plate and the shield electrode member.

Four conductive arms 92C forming the shape of a cross are shown in FIG. 4, having respective ends at the center connected to and supporting electrode body 92A. FIG. 5 is a cross sectional view along line V—V with arrows at respective ends in FIG. 4, illustrating assembling of protection plate 94 and shield electrode member 92. Electrode body 92A and conductive arms 92C both have thickness L1 set at approximately 1 mm and surrounding ring-shaped conductive frame 92B has thickness L2 set at approximately 3 mm. Then, shield electrode member 92, as a whole, has a structure with surrounding conductive frame 92B projecting upward in the shape of a ring in which disk-shaped protection plate 94, with a thickness of approximately 1 to 2 mm, is fit. Protection plate 94 is provided for preventing abnormal discharge from occurring between planar antenna member 76 and shield electrode member 92 (mainly for insulating the body 92A). Protection plate 94 may be formed of the same material as that of insulating plate 72 provided on the ceiling of the chamber, for example, ceramic material such as aluminum nitride and anodized aluminum, quartz, or usual soda-lime glass or the like.

In order to prevent occurrence of abnormal discharge between antenna member 76 and shield electrode member 92, these members 76 and 92 may be separated from each other as described above. If protection plate 94 is not provided, the distance between these members 76 and 92 may be increased until abnormal discharge does not occur.

The diameter of ring-shaped conductive frame 92B is made almost equal to the diameter of process chamber 32.

Accordingly, the periphery of ring-shaped conductive frame 92B is entirely placed in contact with the sidewall at the upper end of process chamber 32 so as to allow the entire shield electrode member 92 to be grounded.

In terms of effective use of microwave, it is preferable that blind part 76A of planar antenna member 76 and electrode body 92A have substantially the same size and are formed substantially at the same position. Further, for effective use of microwave, conductive arms 92C are displaced as much as possible from microwave radiation holes 90 of planar antenna member 76. In FIG. 3, the positions of electrode body 92A and conductive arms 92C are indicated by broken lines.

A processing method applied to the plasma processing apparatus structured as explained above is described below.

Semiconductor wafer W is first placed in process chamber 32 by a transport arm (not shown) via gate valve 68, and a lifter bin (not shown) is moved up and down to set wafer W on a mount plane on the upper side of mount base 34.

Then, the inside of process chamber 32 is maintained at a predetermined process pressure, for example, in the range from 0.01 to several pascals. Argon gas for example is supplied from plasma gas supply nozzle 48 at a controlled flow rate while deposition gas such as $SiH_4$, $O_2$ and $N_2$ for example is supplied from process gas supply nozzle 50 at a controlled flow rate. Simultaneously, microwave from microwave generator 88 is supplied via waveguide 86 and coaxial waveguide 82 to planar antenna member 76 so as to provide the microwave with the wavelength shortened by wave-delay member 78 into process space S. Plasma is thus generated to carry out a predetermined plasma process, for example, a film deposition process by plasma CVD.

The microwave of 2.45 GHz for example produced by microwave generator 88 is mode-converted into TEM mode for example, and then propagated within coaxial waveguide 82 to reach planar antenna member 76 in waveguide box 80. The microwave is then propagated from the central part, which is connected to internal cable 82B, radially to the peripheral part of disk-shaped antenna member 76, while the microwave is transmitted through microwave radiation holes 90, protection plate 94 and insulating plate 72 to be supplied into process space S directly below antenna member 76. Here, microwave radiation holes 90 are formed in a great number in the shape of an elongated slit and arranged concentrically or spirally and almost uniformly over planar antenna member 76.

The microwave excites the argon gas to generate plasma which diffuses downward. The process gas is accordingly activated to generate an active seed. By the action of the active seed, the surface of wafer W is processed, for example, plasma CVD-processed.

Figure 13:
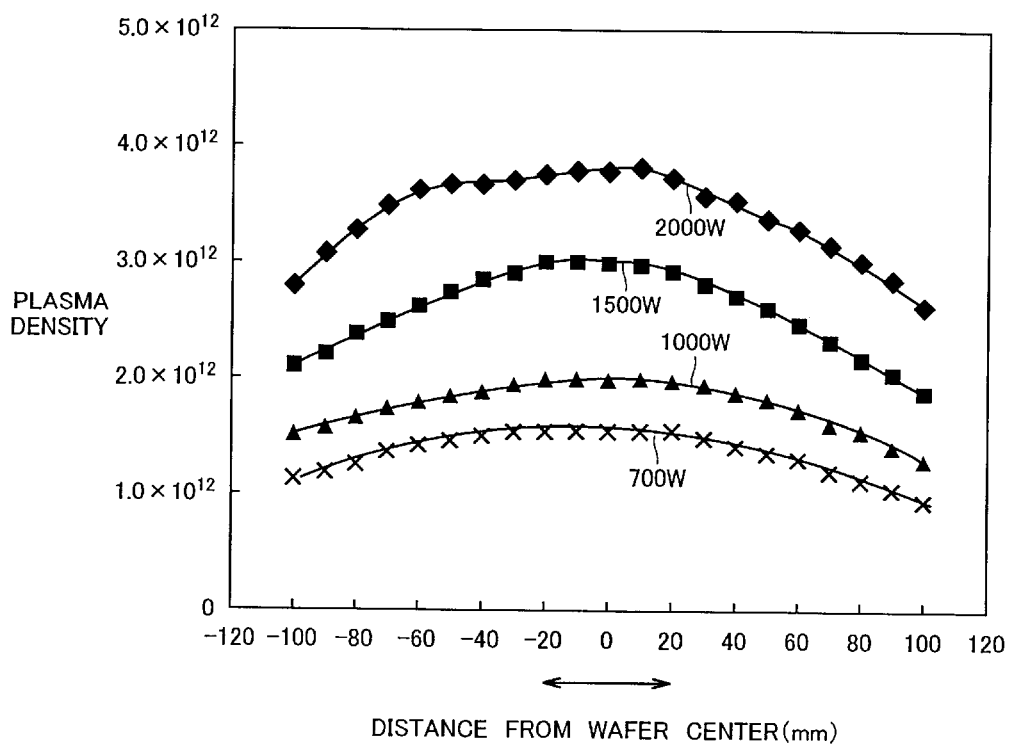
FIG. 13 shows a plasma density distribution in a process space of the conventional apparatus.

In the conventional apparatus having no shield electrode member 92 between planar antenna member 76 and insulating plate 72, the plasma density in the central portion of process space S, which is located directly below the central part of planar antenna member 76, increases to become considerably higher than that in the peripheral portion surrounding the central portion (see FIG. 13). According to the present invention, shield electrode member 92 is provided between those members 76 and 72 so that the microwave radiated from the central part of antenna member 76 is blocked out. Consequently, it is possible to suppress increase of the plasma density in the central portion of process space S as specifically described below. The microwave is mainly radiated downward from each microwave radiation hole 90 of planar antenna member 76. In this type of apparatus, the above-described parallel-plate mode acts and accordingly it inevitably occurs that the microwave is also radiated downward from blind part 76A at the center of planar antenna member 76. In the apparatus of the present invention, disk-shaped electrode body 92A directly below blind part 76A that is grounded absorbs the microwave radiated from blind part 76A. Consequently, further propagation of the microwave never occurs and thus the microwave does not reach the central portion of process space S. Then, increase of the plasma density in the central portion of process space S is suppressed and thus this plasma density is almost equal to that of the surrounding peripheral portion. In this way, the planar uniformity of plasma density in process space S can remarkably be enhanced.

In this case, ring-shaped conductive frame 92B is entirely in contact with the sidewall of the process chamber and grounded, and four conductive arms 92C are crossed to connect to and support electrode body 92A. Accordingly, the characteristic impedance with respect to the microwave can considerably be made small so that the microwave can efficiently be absorbed and thus blocked out.

In addition, as each conductive arm 92C and microwave radiation holes 90 are displaced from each other so as not to match each other in position as much as possible in the direction of radiation of the microwave. Then, the amount of microwave absorbed by each conductive arm 92C can be made as small as possible. If each microwave radiation hole 90 is formed such that the hole is completely displaced from conductive arm 92C, extra absorption of microwave is prevented and thus the efficiency of use of the microwave can be improved. Moreover, the central part of planar antenna member 76 is applied with high-voltage microwave while the surrounding peripheral part is grounded. Then, the antenna peripheral part and ring-shaped conductive frame 92B of shield electrode member 92 may be coupled.

Although shield electrode member 92 is just placed on insulating plate 72 according to this embodiment, these members may be bonded to each other with a heat-resistant adhesive, for example, epoxy-based resin.

Figure 6:
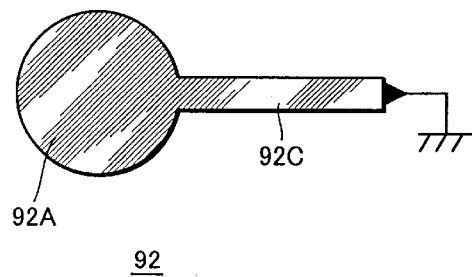
FIG. 6 is a plan view showing another example of the shield electrode.

Four conductive arms 92C are employed here. However, the number of arms is not particularly limited to four and a greater or smaller number of arms may be used to the extent that the transmission efficiency of microwave does not considerably decrease. As one example, a modification of the shield electrode member is shown in plan view of FIG. 6. In this example, a shield electrode member 92 is constituted of a central circular electrode body 92A and one grounded conductive arm 92C. Since electrode body 92A could be supported unstably, electrode body 92A is preferably bonded to the surface of insulating plate 72 by means of epoxy resin or the like as described above. In this case, the characteristic impedance is made higher than that of the embodiment shown in FIG. 4 by the number of decreased conductive arms 92C. On the other hand, the amount of microwave absorbed by conductive arm(s) 92C decreases and accordingly the efficiency of use of microwave can be improved.

The embodiment described above is applied to a case where the microwave, mainly radiated downward by the action of parallel-plate mode from blind part 76A at the center of planar antenna member 76, is blocked out. However, in actual, in addition to the microwave radiated from blind part 76A of planar antenna member 76, a slight amount of microwave is radiated from another planar part of antenna member 76. Then, not only the microwave radiated from blind part 76A of planar antenna member 76 but also the unnecessary microwave radiated from that another planar part may be blocked out. This is implemented by another embodiment of the plasma processing apparatus according to the present invention, as shown in FIG. 7 which is a partially enlarged view thereof showing an insulating plate and a portion therearound, including a shield electrode member providing such a function as discussed above.

Figure 7:
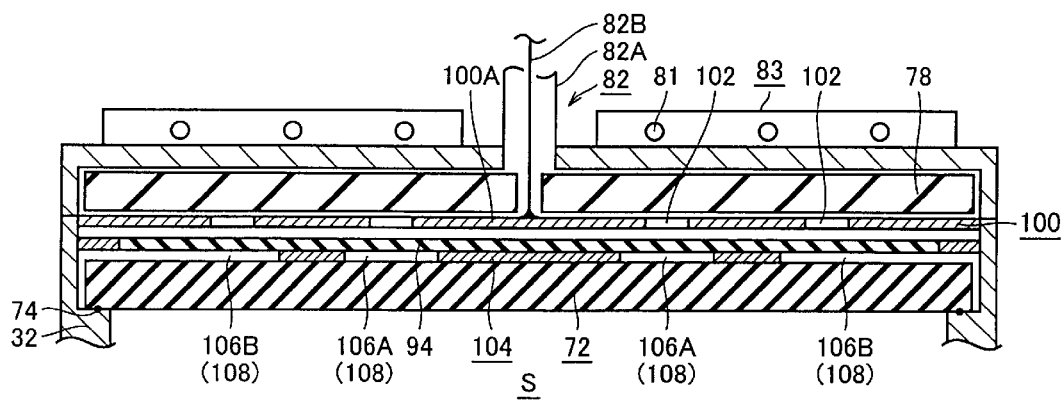
FIG. 7 is a partially enlarged view of a plasma processing apparatus according to another embodiment of the present invention.
Figure 8:
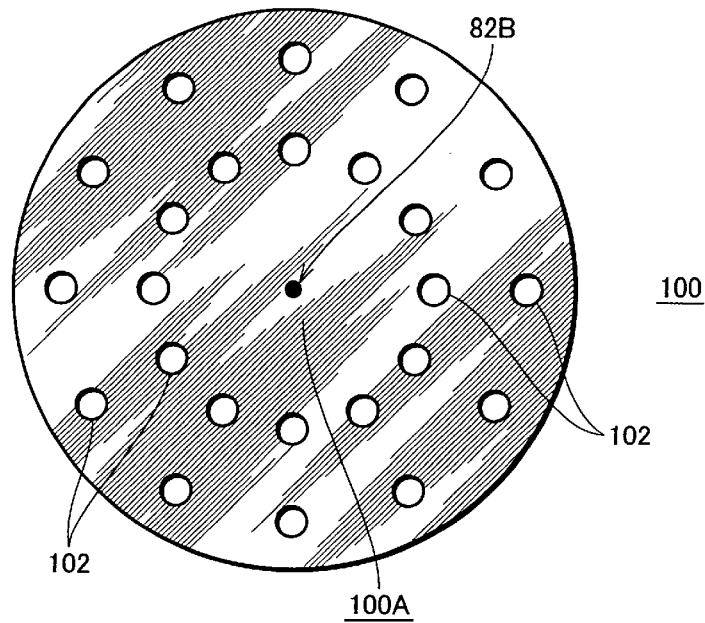
FIG. 8 is a plan view of a planar antenna member shown in FIG. 7.
Figure 9:
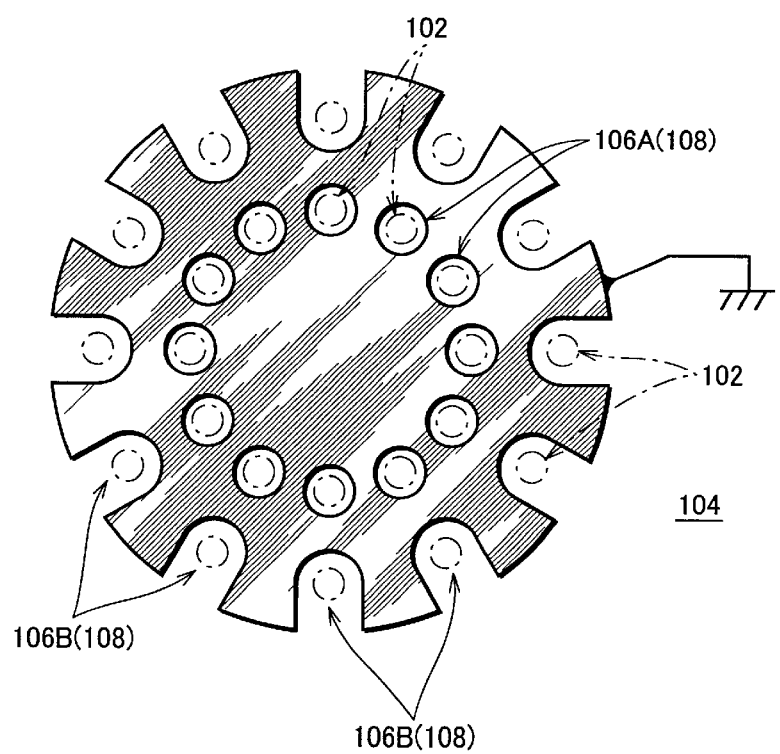
FIG. 9 is a plan view of a shield electrode shown in FIG. 7.

FIG. 8 is a plan view of a planar antenna member in FIG. 7, and FIG. 9 is a plan view of the shield electrode member in FIG. 7. The same component of this another embodiment as that of the structure of the embodiment discussed above is denoted by the same reference character and description thereof is not repeated.

Microwave radiation holes 102 of planar antenna member 100 are not in the shape of a slit as described above. Microwave radiation holes 102 are formed as circular through holes of a predetermined diameter and arranged concentrically in two circles. There is of course no microwave radiation hole 102 formed at the central part of planar antenna member 100 and thus the central part is formed as a blind part 100A. On the other hand, shield electrode member 104 is formed of a conductive plate made of copper for example, having its size almost equal to that of the planar antenna member. In this conductive plate, through holes 106A and through recesses 106B are formed correspondingly to and slightly greater in diameter than microwave radiation holes 102 of planar antenna member 100. In this way, microwave transmission windows 108 are formed.

In addition, a protection plate 94 is provided between shield electrode member 104 and planar antenna member 100 in parallel with each other. The periphery of planar antenna member 100 and the periphery of shield electrode member 104 are both grounded like those of the embodiment described above. Thus, only the microwave radiated from microwave radiation holes 102 is transmitted downward through microwave transmission windows 108 and microwave radiated from another planar part is substantially perfectly blocked out.

In this case, not only the unnecessary microwave radiated from blind part 100A of planar antenna member 100 but also the microwave unnecessarily radiated from another planar part are blocked out as discussed above. Consequently, only the microwave radiated from microwave radiation holes 102 is substantially supplied into process space S where the planar uniformity of the plasma density can further be enhanced.

Here again, protection plate 94 is provided for preventing abnormal discharge. However, protection plate 94 may not be provided. Then, the distance between planar antenna member 100 and shield electrode member 104 is made large enough to prevent abnormal discharge from occurring.

Figure 10:
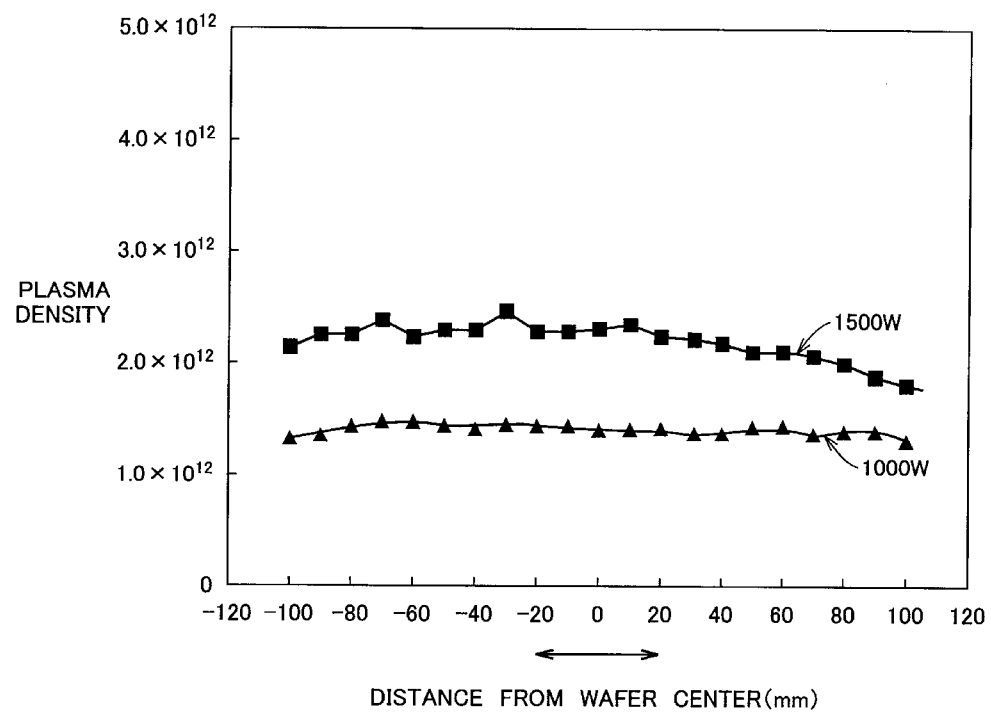
FIG. 10 shows a plasma density distribution in a process space of the apparatus of the present invention.
Figure 11:
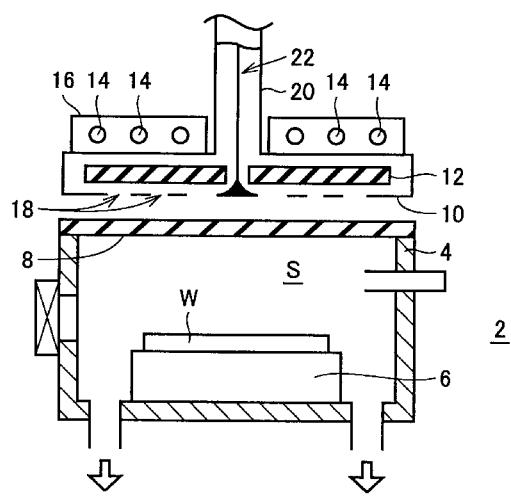
FIG. 11 diagrammatically shows a cross section of a conventional and general plasma processing apparatus.
Figure 12:
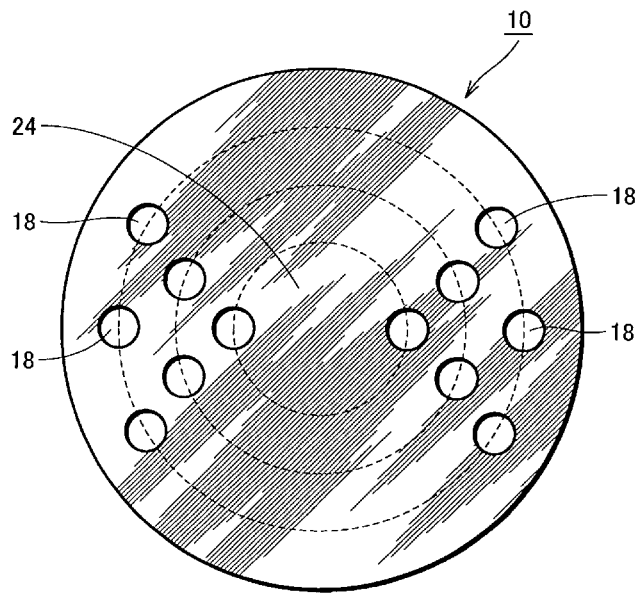
FIG. 12 is a plan view of a planar antenna member.

The apparatus according to the present invention is evaluated as described below. The plasma density distribution in the process space is actually measured by using the apparatuses shown in FIGS. 1–4 and resultant measurements are shown in FIG. 10. Here, the supplying power of microwave is 1000 W and 1500 W. It is clearly seen from comparison with the results of the conventional apparatus shown in FIG. 13 that the plasma density of the central part of the wafer (central portion of process space) is sufficiently reduced and thus the planar plasma density can remarkably be enhanced as a whole.

The description above of the embodiments of the present invention is applied to the film deposition on a semiconductor wafer. However, the embodiments are not limited thereto and applicable to other plasma processes such as plasma etching and plasma ashing.

In addition, the workpiece to be processed is not limited to the semiconductor wafer, and glass substrate, LCD substrate and the like may be employed as a workpiece.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
   a process chamber including an opened ceiling and an internal space which can be evacuated;
   an electrically insulating plate airtightly attached to the ceiling of said process chamber;
   a mount base placed in said process chamber for mounting thereon a workpiece to be processed;
   a planar antenna member formed of an electrically conductive material and placed above said insulating plate and including a plurality of microwave radiation holes for transmitting therethrough microwave used for generating plasma, said microwave transmitted through said insulating plate into said process chamber;
   gas supply means for supplying a predetermined gas into said process chamber; and
   a shield electrode member placed between said insulating plate and said planar antenna member for partially blocking out radiation of the microwave from at least a central portion said planar antenna member, said shield electrode member being spaced from said planar antenna member.

2. The plasma processing apparatus according to claim 1, wherein
   said shield electrode member blocks out radiation of microwave from the center and a part therearound of said planar antenna member.

3. The plasma processing apparatus according to claim 2, wherein said shield electrode member includes a disk-shaped electrode body placed opposite the center of said planar antenna member, a ring-shaped conductive frame placed to concentrically surround said electrode body, and a conductive arm connecting said electrode body and said ring-shaped conductive frame and supporting said electrode body.

4. The plasma processing apparatus according to claim 3, wherein
   said conductive arm is displaced from the microwave radiation hole of said planar antenna member.

5. The plasma processing apparatus according to claim 1, wherein
   said shield electrode member is bonded to be secured onto said insulating plate by an adhesive.

6. The plasma processing apparatus according to claim 1, wherein said shield electrode member is placed between the planar antenna member and a workpiece to be processed.

7. A plasma processing apparatus comprising:
   a process chamber including an opened ceiling and an internal space which can be evacuated;
   an electrically insulating plate airtightly attached to the ceiling of said process chamber;
   a mount base placed in said process chamber for mounting thereon a workpiece to be processed;
   a planar antenna member formed of an electrically conductive material and placed above said insulating plate and including a plurality of microwave radiation holes for transmitting therethrough microwave used for generating plasma, said microwave transmitted through said insulating plate into said process chamber;

gas supply means for supplying a predetermined gas into said process chamber;

a shield electrode member placed between said insulating plate and said planar antenna member for partially blocking out radiation of the microwave from at least a central portion said planar antenna member, said shield electrode member being spaced from said planar antenna member; and a protection plate placed between said shield electrode member and said planar antenna member for preventing discharge from occurring between said shield electrode member and said planar antenna member.

8. The plasma processing apparatus according to claim 7, wherein said shield electrode member blocks out radiation of microwave from the center and a part therearound of said planar antenna member.

9. The plasma processing apparatus according to claim 8, wherein said shield electrode member includes:

a disk-shaped electrode body placed opposite the center and the part therearound of said planar antenna member;

a ring-shaped conductive frame placed to concentrically surround said electrode body; and a conductive arm connecting said electrode body and said ring-shaped conductive frame and supporting said electrode body.

10. The plasma processing apparatus according to claim 9, wherein said conductive arm is displaced from the microwave radiation hole of said planar antenna member.

11. The plasma processing apparatus according to claim 7, wherein said shield electrode member is bonded to be secured onto said insulating plate by an adhesive.

12. The plasma processing apparatus according to claim 7, wherein said shield electrode member is placed between the planar antenna member and a workpiece to be processed.

13. A plasma processing apparatus comprising:

a process chamber including an opened ceiling and an internal space which can be evacuated;

an electrically insulating plate airtightly attached to the ceiling of said process chamber;

a mount base placed in said process chamber for mounting thereon a workpiece to be processed;

a planar antenna member formed of an electrically conductive material and placed above said insulating plate and including a plurality of microwave radiation holes formed at a predetermined pitch for transmitting therethrough microwave used for generating plasma, said microwave transmitted through said insulating plate into said process chamber;

gas supply means for supplying a predetermined gas into said process chamber; and a shield electrode member placed between said insulating plate and said planar antenna member for blocking out radiation of the microwave from the center and a part therearound of said planar antenna member, said shield electrode member being spaced from said planar antenna member.

14. The plasma processing apparatus according to claim 13, further comprising a protection plate placed between said shield electrode member and said planar antenna member for preventing discharge from occurring between said shield electrode member and said planar antenna member.

15. The plasma processing apparatus according to claim 13, wherein said shield electrode member is placed between the planar antenna member and a workpiece to be processed.

* * * * *

UNITED STATES PATENT AND TRADEMARK OFFICE
CERTIFICATE OF CORRECTION

PATENT NO. : 6,656,322 B2
DATED : December 2, 2003
INVENTOR(S) : Toshiaki Hongo et al.

It is certified that error appears in the above-identified patent and that said Letters Patent is hereby corrected as shown below:

Column 10,
Line 30, "portion said" should read -- portion of said --.

Column 11,
Line 9, "portion said" should read -- portion of said --.

Signed and Sealed this

Thirteenth Day of April, 2004

JON W. DUDAS
*Acting Director of the United States Patent and Trademark Office*